United States Patent [19]

Basile

[11] Patent Number: 4,639,614

[45] Date of Patent: Jan. 27, 1987

[54] SOLID STATE RF SWITCH WITH SELF-LATCHING CAPABILITY

[75] Inventor: Philip C. Basile, Turnersville, N.J.

[73] Assignee: RCA Corporation, Princeton, N.J.

[21] Appl. No.: 775,606

[22] Filed: Sep. 13, 1985

[51] Int. Cl.⁴ .................... H03K 17/56; H03K 17/687
[52] U.S. Cl. ................................... 307/243; 307/571; 307/296 R
[58] Field of Search ............................... 307/241–244, 307/470, 571–573, 296 R, 582

[56] References Cited

U.S. PATENT DOCUMENTS

| | | | |
|---|---|---|---|
| 3,280,348 | 10/1966 | Jenson | 307/243 |
| 3,617,770 | 11/1971 | Norton et al. | 307/243 |
| 3,662,113 | 5/1972 | Von Recklinghausen | 307/573 |
| 3,908,136 | 9/1975 | Desperques-Volmier | 307/573 |
| 3,965,459 | 6/1976 | Spencer et al. | 307/243 |
| 4,382,197 | 5/1983 | Kiyozuka | 307/470 |

OTHER PUBLICATIONS

U.S. application Ser. No. 670,620, filed Nov. 13, 1984, for Philip Charles Basile.

Primary Examiner—Stanley D. Miller
Assistant Examiner—B. P. Davis
Attorney, Agent, or Firm—J. S. Tripoli; R. L. Troike; C. L. Maginniss

[57] ABSTRACT

An apparatus for selectively switching between either of two RF clock signal sources utilizes field effect transistors (FET's) as the switching elements. The FET's are driven at their respective base electrodes by complementary signals from open collector logic gates to provide signal source selection. In the event of loss of power to the RF switch, the energy from the RF signal passing through the previously selected switch path provides a positive (enabling) bias to the FET's in that path and a negative (disabling) bias to the FET's in the other path, thereby maintaining the selected path. The open collector logic gate circuits appear as open circuits when power is lost. During normal powered-on operation, the selection logic overrides the RF signal energy biasing circuits.

19 Claims, 4 Drawing Figures

SOLID STATE RF SWITCH WITH SELF-LATCHING CAPABILITY

The Government has rights in this invention pursuant to Contract No. N00039-84-C-0647 awarded by the Department of the Navy.

This invention relates to a radio frequency switch and, more particularly, to an RF signal switching apparatus which employs solid state devices and which maintains signal transmission therethrough even in the event of loss of switch bias power.

BACKGROUND OF THE INVENTION

Highly reliable and accurate frequency time standards are vital to the operation of equipment within an integrated radio room environment. These frequency time standards, which are used to generate clocking signals, allow synchronization between modulating and demodulating equipment and provide highly accurate radio frequency receiver reception.

The need for reliability of these clocking signal sources cannot be overstated. The loss of any one of these sources, even for very short periods of time, may cause functional failures of critical equipment using the clocking signal. As a result, these vital clocking signal sources are generally configured redundantly, so that a back-up source is available in the event of a failure of the primary source. If a clocking signal source does fail, and a switchover is required to place the back-up source on-line, the switchover must take place quickly, in some instances within only a few cycles of the clocking signal. For a 5 MHz signal, which will be the signal frequency considered within this disclosure, the switchover must take place typically within one microsecond.

Another requirement of the redundant source switching apparatus is that it retain a through path between the clocking signal source and the clocking signal users, e.g., radio equipment, even in the event of a loss of power to the switching apparatus.

According to the present technology, there are devices which will satisfy the requirement for high switchover speeds, and there are devices which will retain a through path despite loss of power, but there are no known devices which can satisfy both requirements. Bipolar transistor and field effect transistor (FET) technology can switch between either of two signal sources at speeds as fast as 100 nanoseconds. This would satisfy the switching time requirement. These bipolar transistors and FET's, however, require biasing to maintain the through connection. When switchover equipment apparatus power is lost, the through connection configuration is also lost and the reference signal to the user equipment is disrupted, often with disastrous effects.

Relay technology, using self-latching techniques, can maintain a through connection even when power is interrupted for an indeterminate length of time. However, the latching relay's physical characteristics limit its switching time to a minimum of several milliseconds. For a 5 MHz clock signal, such a delay translates to a loss of tens of thousands of cycles, and would necessarily cause severe user equipment problems during switching.

SUMMARY OF THE INVENTION

In accordance with the principles of the present invention, an apparatus is disclosed for selectively enabling an input ac signal to a utilization means. The apparatus, which includes means for providing a bias voltage and an input control signal, comprises a switching device having input, output and control terminals. The switching device is responsive to an enabling voltage level at its control terminal for enabling signal flow between its input and output terminals, and is responsive to an inhibiting voltage level at its control terminal for inhibiting signal flow between its input and output terminals. The apparatus additionally comprises first coupling means for coupling the input ac signal to the switching device input terminal and second coupling means for coupling the utilization means to the switching device output terminal. The apparatus further comprises means responsive to the bias voltage and the input control signal for providing a switch control signal having an enabling voltage level in response to a first voltage level of the input control signal and an inhibiting voltage level in response to a second voltage level of the input control signal. The apparatus further comprises means for detecting the ac signal enabled through the switching device and for providing therefrom a dc signal having the enabling voltage level. Finally, the apparatus comprises means for summing the switch control signal and the dc signal, and for applying the summed signal to the control terminal of the switching device, whereby the switching device is actuated in accordance with the input control signal during the presence of the bias voltage, and is actuated in accordance with the detected level of the ac signal enabled through the switching device in the absence of the bias voltage.

DETAILED DESCRIPTION OF THE PREFERRED EMBODIMENT

Figure 1:
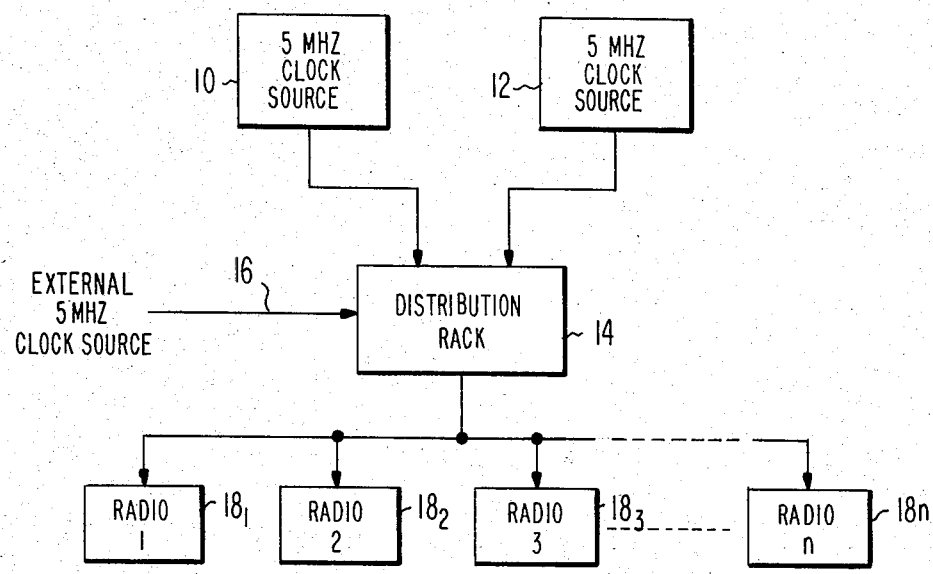
FIG. 1 is a block diagram of a radio communications system in which the present invention finds application.

Referring to FIG. 1, there is shown in block diagram form several elements of a typical radio room. Redundant sources of clock signal, shown as 5 MHz clock source 10 and 5 MHz clock source 12, are coupled to a clock distribution rack 14, which includes the RF switch of the present invention. Distribution rack 14 may also include an apparatus for monitoring the frequency of clock sources 10 and 12 in accordance with the teachings of U.S. patent application Ser. No. 670,620, filed Nov. 13, 1984, now U.S. Pat. No. 4,583,054 for the present inventor, and assigned to the same assignee as the present invention. Such a frequency monitoring apparatus requires a third time standard, equal in frequency to the other two, which is shown in FIG. 1 as the external 5 MHz clock source coupled to distribution rack 14 via signal lead 16.

Distribution rack 14 selects a clock signal from among sources 10 and 12 and distributes it to each of the n radios $18_1, 18_2, 18_3, \ldots, 18_n$. Because of the redundancy of the sources 10 and 12, the radio room system of FIG. 1 is immune to catastrophic failure resulting from a single failure, with the possible exception of a failure of the clock signal switch within distribution rack 14. The RF switch of the present invention maintains the selected clock signal therethrough even during a power interruption in distribution rack 14.

Figure 2:
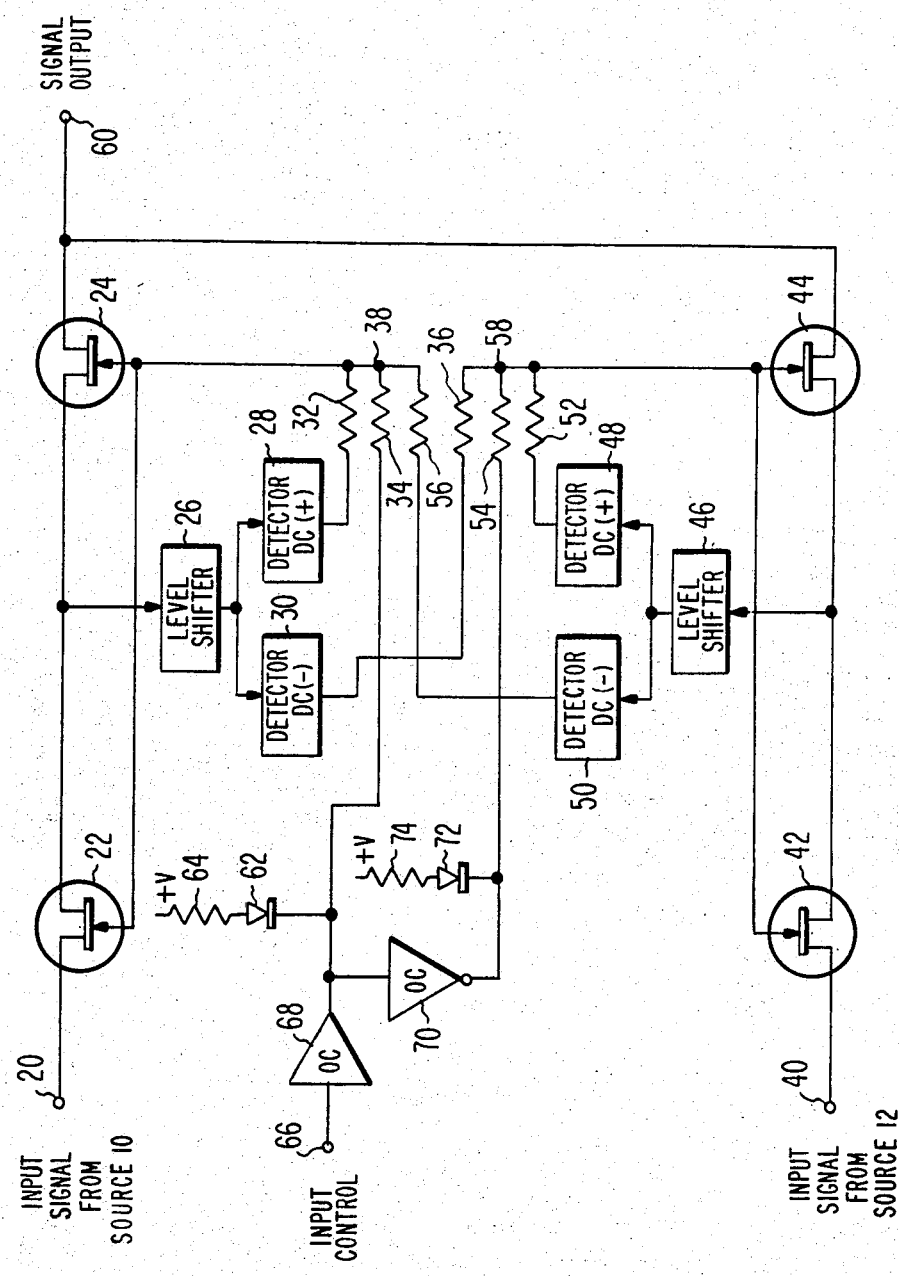
FIG. 2 is a detailed diagram of an RF switch according to the present ivnention.

Referring now to FIG. 2, there is shown an RF switch according to the present invention. Input signals from sources 10 and 12, which may illustratively be from two 5 MHz clock sources, are coupled at input terminals 20 and 40, respectively. If the path including FET's 22 and 24 is enabled, i.e., the FET's are in their low impedance state, then the signal from source 10 appears at output terminal 60. If, on the other hand, the path including FET's 42 and 44 is enabled, then the signal from source 12 appears at output terminal 60.

When the signal from source 10 is enabled through FET's 22 and 24, the RF signal between the two FET's is coupled to level shifter 26 which increases the signal level. As an example, level shifter 26 may comprise an RF transformer having a turns ratio of one to ten between its input and output windings, respectively, thereby providing a tenfold increase in signal level at the output terminal of level shifter 26. The output signal of level shifter 26 is coupled to detectors 28 and 30. Detector 28 provides a positive dc signal which is derived from the energy of the output signal from level shifter 26. The dc voltage level output from detector 28 is preferably at least +5 volts. Detector 30 provides a negative dc signal which is also derived from the energy of the output signal from level shifter 26. For reason of symmetry and the basic similarity between detectors 28 and 30, the output voltage level from detector 30 is correspondingly at least as negative as −5 volts. Preferred embodiments of detectors 28 and 30 are described in detail in FIGS. 3a and 3b, respectively, and in the text relating thereto.

The output signal of detector 28 is coupled to summing point 38 through a high impedance resistor 32, which may typically have a resistance of 100 kilohms. The output signal of detector 30 is coupled to summing point 58 through a high impedance resistor 36, which may also typically have a resistance of 100 kilohms. Summing point 38 is coupled to the gate electrodes of both FET's 22 and 24, and the voltage thereon determines whether these two FET's are in their low impedance or high impedance states. Similarly, summing point 58 is coupled to the gate electrodes of both FET's 42 and 44, and the voltage thereon determines whether these two FET's are in their low impedance or high impedance states.

The FET's of the present example are shown as n-channel devices and may illustratively have a threshold of +3.5 volts at their gate electrodes for switching between their "on" (low impedance) and "off" (high impedance) states. Such a device may typically be presumed to be fully "on" when the gate electrode voltage is +5 volts or more, and fully "off" when the gate electrode voltage is +2 volts or less.

Level shifter 46 and detectors 48 and 50 are virtually identical to level shifter 26 and detectors 28 and 30, respectively. Thus, it is seen that detector 48 provides a positive dc signal, and detector 50 provides a negative dc signal, both of which are derived from the energy of the output signal from level shifter 46.

The output signal of detector 48 is coupled to summing point 58 through a high impedance resistor 52, and the output signal of detector 50 is coupled to summing point 38 through a high impedance resistor 56. Typically, resistors 32, 36, 52 and 56 all have the same value of resistance.

It is important to note that level shifters 26 and 46, and detectors 28, 30, 48 and 50 are completely passive devices, operating solely from the energy of their applied RF signals.

An input control signal, by which changes in the signal output may be effected, is coupled to the RF switch at terminal 66. The signal is coupled to the input of buffer 68, which may be a non-inverting logic gate having an open-collector output, similar to type SN7407, sold by TEXAS Instruments, Inc., Dallas, Tex. The output signal of buffer 68 is pulled up to a bias voltage level shown as +V, through resistor 64 and diode 62, and is coupled to summing point 38 through resistor 34. The resistance value of resistor 34 is selected as one order to magnitude less than the resistance of resistors 32 and 56, and typically may be 10 kilohms. The +V voltage level is at least +5 volts.

The output signal of buffer 68 is also coupled to the input of inverter 70, which may be an inverting logic gate having an open-collector output, similar to type SN7406. The output signal of inverter 70 is pulled up to a voltage level, +V, through resistor 74 and diode 72, and is coupled to summing point 58 through resistor 54 which, like resistor 34, is typically selected as one order to magnitude less than resistors 36 and 52.

The operation of the RF switch of FIG. 2 will be considered under two circumstances: first, in a normal condition, with supply power applied to the elements of the RF switch; and second, with no power applied thereto. Under normal power conditions, a logic level signal, typically assuming a value of either +5 or 0 volts, applied at input terminal 66, provides a corresponding output level of +V or 0 volts, respectively, at the output of buffer 68. This output signal then causes an output signal level of 0 or +V, respectively at the output of inverter 70. It is therefore easily seen that the output signal levels as between buffer 68 and inverter 70 are complementary. Thus, the output signal from buffer 68 is applied to summing point 38 through relatively low impedance resistor 34, and the complementary signal from inverter 70 is applied to summing point 58 through relatively low impedance resistor 54.

Whichever summing point, as between 38 and 58, has the higher voltage signal level, which level is substantially equal to +V, that point provides an enabling signal to the corresponding pair of switching FET's. When summing point 38 is held at the +V voltage level as a result of a high logic level at switch control input terminal 66, FET's 22 and 24 are enabled to their low impedance state, and the input signal from source 10 at input terminal 20 passes through FET's 22 and 24 to output terminal 60. The signal passing between FET's 22 and 24 is sampled by level shifter 26 which increases the voltage level of the signal. The increased signal level is detected by detector 28 which applies a positive voltage level to summing point 38 through relatively high impedance resistor 32. The increased signal level is also detected by detector 30 which applies a negative voltage level to summing point 58 through relatively high impedance resistor 36.

Since the output signal from inverter 70 is the complement of the output signal from buffer 68, summing point 58 is driven to essentially zero volts through resistor 54 when summing point 38 is high. As a result, the signal at the gate electrodes of FET's 42 and 44 is disabling and the FET's are in their high impedance state. Thus, level shifter 46 sees no RF signal, detectors 48 and 50 detect no signal and therefore produce no dc output signal to summing points 58 and 38, respectively.

Under the conditions described for a high level signal at input terminal 66, summing point 38 sees a positive voltage level through high impedance resistor 32, a positive voltage level through relatively low impedance resistor 34, and a virtual open circuit through high impedance resistor 56. Under these same conditions, summing point 58 sees a negative voltage level through high impedance resistor 36, a zero volt level through relatively low impedance resistor 54, and a virtual open circuit through high impedance resistor 52.

When the signal at switch control input terminal 66 is driven low, the output signal from buffer 68 goes substantially to zero volts and the output signal from inverter 70 goes substantially to +V volts. The zero volt contribution through low impedance resistor 34 to summing point 38 effectively swamps out the positive voltage contribution from detector 28 through high impedance resistor 32, and FET's 22 and 24 are switched into their high impedance states. The +V contribution through low impedance resistor 54 to summing point 58 effectively swamps out the negative voltage contribution from detector 30 through high impedance resistor 36, and FET's 42 and 44 are switched into their low impedance states.

As soon as the RF signal starts to flow through FET's 42 and 44 to output signal terminal 60, level shifter 46 and detectors 48 and 50 use the energy of the RF signal to provide a positive voltage signal to summing point 58 through resistor 52 and a negative voltage signal to summing point 38 through resistor 56.

It has thus been shown that the RF switch of FIG. 2 responds to signal level changes at input terminal 66 to switch between the input signals from sources 10 and 12 applied, respectively, at terminals 20 and 40. It remains to be shown how the RF switch operates when the power source to distribution rack 14 is lost.

The only elements in the RF switch of FIG. 2 which rely on a power supply are buffer 68, inverter 70, and the two resistor-diode networks biasing their open collector outputs. When the power is lost, the output transistors of devices 68 and 70 appear as open circuits, and the polarities of diodes 62 and 72 make the biasing networks appear as open circuits. Thus, under a power failure condition, summing point 38 sees an essentially open circuit through resistor 34, and summing point 58 seen an essentially open circuit through resistor 54.

Since it is a purpose of the present invention to retain the current clock source signal to the several radios in the event of power failure to the RF switch in distribution rack 14, the energy of the through-connected signal is used to maintain the switch status. Assume for example, that the input signal from source 10 is being coupled through FET's 22 and 24 to output terminal 60 when distribution rack 14 loses power. Summing point 38 will see only a positive voltage level from detector 28 through resistor 32, and virtual open circuits through resistors 34 and 56. Summing point 58 will see only a negative voltage level from detector 30 through resistor 36, and virtual open circuits through resistors 52 and 54. The positive voltage at summing point 38 will maintain FET's 22 and 24 in their low impedance states and the negative voltage at summing point 58 will maintain FET's 42 and 44 in their high impedance states.

By analogy, it is easily seen that a failure of the power supplies to the RF switch when the input signal from source 12 is being coupled through FET's 42 and 44 to output terminal 60 will maintain that through connection, by developing a positive voltage bias to the gate electrodes of FET's 42 and 44 and a negative bias to FET's 22 and 24 from the energy of the through-connected RF signal.

Figures 3A, 3B:
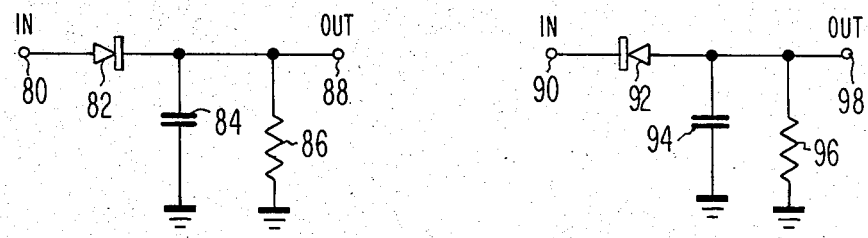
FIGS. 3a and 3b illustrate in detail the positive voltage and negative voltage detectors, respectively, of the FIG. 2 embodiment.

FIG. 3a illustrates a detector circuit which provides a positive dc signal at output terminal 88 when an RF signal, such as the 5 MHz clock signal, is aplied at input terminal 80. Diode 82 is poled to pass only the positive half of each input signal cycle, and the RC network comprising capacitor 84 and resistor 86 is selected such that its time constant is many multiples of the input signal period. For an input signal frequency of 5 MHz, for which the period of one cycle is 200 nanoseconds, $\tau = RC$ may typically be 50 microseconds, which is 250 times the input signal period. Illustratively, capacitor 84 may have a value of 50 picofarads and resistor 86 may have a value of one megohm. Thus, the detector of FIG. 3a provides a relatively steady positive dc signal at terminal 88 when an RF signal is present at terminal 80, and substantially zero volts when no signal is present.

FIG. 3b illustrates a detector circuit which provides a negative dc signal at output terminal 98 when an RF signal, such as the 5 MHz clock signal, is applied at input terminal 90. Diode 92 is poled to pass only the negative half of each input signal cycle. Otherwise, components 94 and 96 may be identical to components 84 and 86, respectively, of the FIG. 3a detector. Thus, the detector of FIG. 3b provides a relatively steady negative dc signal at terminal 98 when an RF signal is present at terminal 90, and substantially zero volts when no signal is present.

FET's are well-suited for use as the switching elements of the RF switch of the present invention, as they have virtually infinite "off" impedance, very low "on" impedance, and they are responsive to voltage level changes at their gate electrodes such as to switch between "on" and "off" states within a few hundred nanoseconds. The specific FET's chosen as elements 22, 24, 42 and 44 may each be of a type similar to IRF630, an n-channel power MOSFET, sold by International Rectifier Corp., El Segundo, Calif. The IRF630 FET is particularly well-suited to this application as it has a 0.1 ohm "on" impedance, as compared to an approximately 3 ohm "on" impedance in FET's of the standard technology. The low impedance is of great importance when driving a typical load presenting a relatively low input impedance, such as 50 ohms, as it is desirable to minimize the power loss in the switch.

By way of summary, it is seen that the RF switch of the present invention permits selection of either of two RF signal sources, with switching speeds at semiconductor switching rates, and which uses the energy of the through-connected signal to self-bias the FET switching elements so as to maintain the present through path in the event of a loss of power to the RF switch.

While the principles of the present invention have been demonstrated with particular regard to the illustrated structure of the figures, it will be recognized that various departures from such illustrative structure may be undertaken in the practice of the invention. As an example, the FIG. 2 embodiment depicts an RF switch which can select an output signal from among two input sources. It would be relatively simple matter to extend the FIG. 2 embodiment to be a one-of-n switch by providing one-of-n selection at the switch control, and by providing n switch sections each comprising elements similar to FET's 22 and 24, level shifter 26 and detectors 28 and 30. Each summing point, e.g., node 38, would require a relatively low impedance summing resistor from the switch control, e.g., resistor 34, a relatively high impedance summing resistor from the positive voltage detector, e.g., resistor 32, and n-1 relatively high impedance summing resistors from the n-1 other switch sections. The scope of this invention is not intended to be limited to the structure disclosed herein but should instead be gauged by the breadth of the claims which follow.

What is claimed is:

1. An apparatus for selectively enabling an input ac signal to a utilization means, said apparatus including means for providing a bias voltage and an input control signal, said apparatus comprising:

a switching device having input, output and control terminals, said device being responsive to an enabling voltage level at said control terminal for enabling signal flow between said input and said output terminals, and responsive to an inhibiting voltage level at said control terminal for inhibiting signal flow between said input and said output terminals;

first coupling means for coupling said input ac signal to said switching device input terminal;

second coupling means for coupling said utilization means to said switching device output terminal;

means responsive to said bias voltage and said input control signal for providing a switch control signal, said switch control signal having an enabling voltage level in response to a first voltage level of said input control signal, and having an inhibiting voltage level in response to a second voltage level of said input control signal;

means for detecting the ac signal enabled through said switching device and for providing therefrom a dc signal having said enabling voltage level; and means for summing said switch control signal and said dc signal, and for applying the summed control signal to said control terminal of said switching device, whereby said switching device is actuated in accordance with said input control signal during the presence of said bias voltage, and is actuated in accordance with the detected level of the ac signal enabled through said switching device in the absence of said bias voltage.

2. The apparatus according to claim 1 wherein said means for providing a switch control signal includes means for providing an open circuit condition at said summing means in the absence of said bias voltage.

3. The apparatus according to claim 2 wherein said means for providing an open circuit includes a digital logic circuit having open collector output terminal.

4. The apparatus according to claim 1 wherein said switching device includes a field effect transistor.

5. The apparatus according to claim 1 wherein said detecting means further includes a level shifter for increasing the voltage level of said ac signal enabled through said switching device.

6. The apparatus according to claim 5 wherein said detecting means further includes:

a diode coupled to the output of said level shifter poled so as to pass only the positive cycles of the output signal of said level shifter; and a resistor-capacitor network for storing the energy of the signal passed by said diode.

7. The apparatus according to claim 1 wherein said summing means includes a relatively high impedance device coupled between said detecting means and said switching device control terminal and a relatively low impedance device coupled between said means for providing a switch control signal and said switching device control terminal.

8. An apparatus for enabling a selected one of a first input ac signal and a second input ac signal to a utilization means, said apparatus including means for providing a bias voltage and an input control signal, said apparatus comprising:

first and second switching devices each having input, output and control terminals, each of said devices being responsive to an enabling voltage level at said control terminal for enabling signal flow between said input and said output terminals, and responsive to an inhibiting voltage level at said control terminal for inhibiting signal flow between said input and said output terminals;

first coupling means for coupling said first input ac signal to said first switching device input terminal;

second coupling means for coupling said second input ac signal to said second switching device input terminal;

third coupling means for coupling said utilization means to said first and second switching device output terminals;

means responsive to said bias voltage and said input control signal for providing first and second complementary switch control signals, each of said complementary switch control signals being reciprocally selectable between an enabling voltage level and an inhibiting voltage level in response to first and second voltage levels of said input control signal;

first means coupled to said first switching device for detecting the ac signal enabled through said first switching device and for providing therefrom a first dc signal having said enabling voltage level;

second means coupled to said second switching device for detecting the ac signal enabled through said second switching device and for providing therefrom a second dc signal having said enabling voltage level;

first means for summing said first switch control signal and said first dc signal, and for applying the signal obtained by said summing to said control terminal of said first switching device; and second means for summing said second switch control signal and said second dc signal, and for applying the signal obtained by said summing to said control terminal of said second switching device, whereby said first and second switching devices are actuated in complementary manner in accordance with said input control signal during the presence of said bias voltage, and are actuated in accordance with the detected level of the ac signals enabled through said first and second switching devices in the absence of said bias voltage.

9. The apparatus according to claim 8 further including:

third means coupled to said first switching device for detecting the ac signal enabled through said first switching device and for providing therefrom a third dc signal having said inhibiting voltage level; and fourth means coupled to said second switching device for detecting the ac signal enabled through said second switching device and for providing therefrom a fourth dc signal having said inhibiting voltage level, said first summing means further summing said fourth dc signal with said first switch control signal and said first dc signal, said second summing means further summing said third dc signal with said second switch control signal and said second dc signal.

10. The apparatus according to claim 8 wherein said means for providing switch control signals includes means for providing open circuit conditions at said first and second summing means in the absence of said bias voltage.

11. The apparatus according to claim 10 wherein said means for providing open circuit conditions includes digital logic circuits having open collector output terminals.

12. The apparatus according to claim 8 wherein said first and second switching devices include field effect transistors.

13. The apparatus according to claim 9 further including:
a first level shifter coupled between said first switching device output terminal and said first and third detecting means for increasing the voltage level of the ac signal enabled through said first switching device; and
a second level shifter coupled between said second switching device output terminal and said second and fourth detecting means for increasing the voltage level of the ac signal enabled through said second switching device.

14. The apparatus according to claim 13 wherein said first and second detecting means each further includes:
a diode coupled to the output of the level shifter coupled thereto, said diodes poled so as to pass only the positive cycles of the output signal of said level shifter; and
a resistor-capacitor network for storing the energy of the signal passed by said diode.

15. The apparatus according to claim 13 wherein said third and fourth detecting means each further includes:
a diode coupled to the output of the level shifter coupled thereto, said diode poled so as to pass only the negative cycles of the output signal of said level shifter; and
a resistor-capacitor network for storing the energy of the signal passed by said diode.

16. The apparatus according to claim 9 wherein said first summing means includes a first relatively high impedance device coupled between said first detecting means and said first switching device control terminal, a second relatively high impedance device coupled between said fourth detecting means and said first switching device control terminal, and a first relatively low impedance device coupled between said means for providing switch control signals and said first switching device control terminal.

17. The apparatus according to claim 16 wherein said second summing means includes a third relatively high impedance device coupled between said second detecting means and said second switching device control terminal, a fourth relatively high impedance device coupled between said third detecting means and said second switching device control terminal, and a second relatively low impedance device coupled between said means for providing switch control signals and said second switching device control terminal.

18. The apparatus according to claim 8 wherein said third coupling means includes third and fourth switching devices, each having input, output and control terminals, each of said devices being responsive to an enabling voltage level at said control terminal for enabling signal flow between said input and said output terminals, and responsive to an inhibiting voltage level at said control terminal for inhibiting signal flow between said input and said output terminals,
said third switching device being coupled at its control terminal to said first switching device control terminal,
said fourth switching device being coupled at its control terminal to said second switching device control terminal,
said third switching device being coupled at its input terminal to said first switching device output terminal,
said fourth switching device being coupled at its input terminal to said second switching device output terminal; and
said third coupling means further including means for coupling said utilization means to said third and fourth switching device output terminals.

19. The apparatus according to claim 18 wherein said third and fourth switching devices include field effect transistors.

* * * * *